(12) United States Patent
Chen et al.

(10) Patent No.: US 12,396,140 B2
(45) Date of Patent: Aug. 19, 2025

(54) SYSTEM AND METHOD FOR HYBRID DIRECT-TO-CHIP LIQUID AND IMMERSION COOLING

(71) Applicant: Quanta Computer Inc., Taoyuan (TW)

(72) Inventors: Chao-Jung Chen, Taoyuan (TW); Yu-Nien Huang, Taoyuan (TW); Herman Tan, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 214 days.

(21) Appl. No.: 18/473,199

(22) Filed: Sep. 22, 2023

(65) Prior Publication Data

US 2025/0040101 A1   Jan. 30, 2025

Related U.S. Application Data

(60) Provisional application No. 63/515,537, filed on Jul. 25, 2023.

(51) Int. Cl.
*H05K 7/20* (2006.01)

(52) U.S. Cl.
CPC ....... *H05K 7/2079* (2013.01); *H05K 7/20236* (2013.01); *H05K 7/20254* (2013.01)

(58) Field of Classification Search
CPC ............. H05K 7/2079; H05K 7/20236; H05K 7/20254; H05K 7/20772; H05K 7/206
See application file for complete search history.

(56) References Cited

U.S. PATENT DOCUMENTS

| | | | | |
|---|---|---|---|---|
| 9,622,379 | B1* | 4/2017 | Campbell | .......... H05K 7/20318 |
| 2011/0315353 | A1* | 12/2011 | Campbell | .......... H05K 7/20809 |
| | | | | 165/104.31 |

(Continued)

FOREIGN PATENT DOCUMENTS

| | | | | |
|---|---|---|---|---|
| CA | 2751096 C | * | 2/2016 | .......... G01P 13/0026 |
| CN | 108304054 A | | 7/2018 | |
| CN | 115707206 A | | 2/2023 | |

OTHER PUBLICATIONS

TW Office Action for Application No. 113102029 mailed Aug. 9, 2024, w/ First Office Action Summary, 9 pp.

(Continued)

*Primary Examiner* — Abhishek M Rathod
(74) *Attorney, Agent, or Firm* — NIXON PEABODY LLP

(57) ABSTRACT

A hybrid cooling system is configured to receive heat-generating components of an information technology (IT) device. The system includes a chassis having a peripheral wall that extends between a chassis base and an open top surface, the peripheral wall forming an enclosure between an upstream side and a downstream side. An immersion conduit delivers an immersion coolant and fills the enclosure to fully immerse the heat-generating components. An outlet duct drain overflow of the immersion coolant accumulated in the enclosure. A cold plate within the enclosure is configured for direct contact with at least one heat-generating component. A supply conduit delivers a direct coolant in cooled form within the cold plate, and is in flow communication with a cold plate inlet connector. A return conduit removes the direct coolant in heated form from the cold plate, and is in flow communication with a cold plate outlet connector.

14 Claims, 10 Drawing Sheets

(56) References Cited

U.S. PATENT DOCUMENTS

| | | | |
|---|---|---|---|
| 2014/0133099 A1* | 5/2014 | Campbell | H05K 7/20818 361/698 |
| 2022/0210949 A1 | 6/2022 | Edmunds et al. | |
| 2023/0046075 A1* | 2/2023 | Chen | H05K 7/20272 |

OTHER PUBLICATIONS

TW Search Report for Application No. 113102029 mailed Aug. 9, 2024, w/ First Office Action, 1 p.

* cited by examiner

SYSTEM AND METHOD FOR HYBRID DIRECT-TO-CHIP LIQUID AND IMMERSION COOLING

RELATED APPLICATIONS

This application claims priority to and the benefit of U.S. Provisional Application No. 63/515,537, filed on Jul. 25, 2023, which is incorporated herein by reference in its entirety.

FIELD OF THE INVENTION

The present invention relates generally to cooling of an information technology ("IT") system, and more specifically, to hybrid cooling that combines immersion cooling and direct-contact cooling.

BACKGROUND OF THE INVENTION

IT systems, including server systems, require cooling to prevent overheating. Cooling demands have increased, as the power and speed of server systems have increased. Immersion cooling for the IT system is one preferred method of cooling, which requires immersing components of the IT system (e.g., mainboard, storage devices, add-on-card, power supply unit) into a tank that is filled with a cooling liquid. The cooling liquid acts as a medium for dissipating heat generated from the components of the IT system. However, physical space (e.g., existing industrial rack or cabinet footprint) and budgets associated with present immersion cooling of IT systems are severely limited, resulting in drastic cooling problems. Moreover, immersion cooling has limited cooling capacity when highly-localized power components, such as main computing chips, such as central processing units (CPUs) or graphic processing units (GPUs), are included in the IT system. The present disclosure provides a solution for these and other problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a hybrid cooling system is directed to an information technology (IT) device, and includes a chassis having a peripheral wall that extends between a chassis base and an open top surface. The peripheral wall forms an enclosure between an upstream side and a downstream side. The chassis is configured to receive heat-generating components of the IT device within the enclosure. The system further includes an immersion conduit for delivering an immersion coolant within the enclosure. The immersion coolant fills the enclosure to immerse the heat-generating components. The system further includes an outlet duct for draining overflow of the immersion coolant accumulated in the enclosure. The system further includes a cold plate positioned within the enclosure and configured for mounting in direct contact with at least one of the heat-generating components. The cold plate has an inlet connector and an outlet connector. The system further includes a supply conduit for delivering a direct coolant in cooled form within the cold plate, the supply conduit being in flow communication with the inlet connector. The system further includes a return conduit for removing the direct coolant in heated form from the cold plate, the return conduit being in flow communication with the outlet connector.

According to some features of the above aspects, the chassis has a rear opening in the downstream side, the rear opening blocked by a movable flap in a closed position. The movable flap has a flap height that is lower than a wall height of the peripheral wall. According to other features of the above aspects, the outlet duct automatically receives the overflow of the immersion coolant when an accumulation of the immersion coolant reaches the flap height. According to yet other features of the above aspects, the movable flap is rotatable between the closed position, in which at least some of the immersion coolant accumulates in the enclosure, and an open position, in which at least some of the immersion coolant drains from the enclosure.

According to yet other features of the above aspects, the immersion conduit is routed alongside a lateral side the peripheral wall that extends between the upstream side and the downstream side. According to yet other features of the above aspects, the immersion conduit has an inlet end that is fluidly coupled with an immersion quick-disconnect connector, the immersion quick-disconnect connector being mounted in the downstream side near the lateral side. According to yet other features of the above aspects, the immersion conduit has an immersion-delivery side positioned along the upstream side, the immersion conduit delivering the immersion coolant near the upstream side.

According to yet other features of the above aspects, the direct coolant is different than the immersion fluid. According to yet other features of the above aspects, the direct coolant is a dielectric fluid and the immersion fluid is a non-dielectric fluid.

According to yet other features of the above aspects, the system further includes another cold plate positioned within the enclosure and configured for mounting in direct contact with at least one of the heat-generating components, the another cold plate having another inlet connector and another outlet connector. The system further includes another supply conduit for delivering another direct coolant in cooled form within the cold plate, the another supply conduit being in flow communication with the another inlet connector. The system further includes another return conduit for removing the another direct coolant in heated form from the another cold plate, the another return conduit being in flow communication with the another outlet connector.

According to other aspects of the present disclosure, a computing assembly is directed to hybrid immersion cooling and includes a computing rack configured to house a plurality of information technology (IT) devices. The assembly further includes a coolant supply manifold positioned along one end of a downstream side, and a coolant draining manifold positioned along an opposite end of the downstream side. The assembly further includes a plurality of chassis slidably mounted within the computing rack, each chassis of the plurality of chassis being configured to receive a respective IT device of the plurality of IT devices. Each chassis has a peripheral wall that forms an enclosure between an upstream side and a downstream side, the enclosure being configured to receive heat-generating components of the IT device. Each chassis further has an immersion conduit for delivering an immersion coolant within the enclosure, the immersion coolant filling the enclosure to fully immerse the heat-generating components. Each chassis further has a cold plate positioned within the enclosure and configured for mounting in direct contact with at least one of the heat-generating components, the cold plate having an inlet connector and an outlet connector. Each chassis further has a supply conduit for delivering a direct coolant in cooled form within the cold plate, the supply conduit being in flow communication with the inlet connector.

According to some features of the above aspects, the assembly further includes an outlet duct for draining overflow of the immersion coolant accumulated in the enclosure.

According to other features of the above aspects, the assembly further includes a return conduit for removing the direct coolant in heated form from the cold plate, the return conduit being in flow communication with the outlet connector.

According to yet other features of the above aspects, the coolant supply manifold and the coolant draining manifold are mounted generally vertically along the downstream side.

According to yet other features of the above aspects, each chassis is mounted generally horizontally in the computing rack.

According to yet other aspects of the present disclosure, a method is directed to hybrid cooling of an information technology (IT) system. The method includes providing a chassis with a peripheral wall extending between a chassis base and an open top surface, the peripheral wall forming an enclosure between an upstream side and a downstream side. The peripheral wall has a rear opening blocked with a flap, the flap being movable between a closed position and an open position. The method further includes receiving heat-generating components of the IT system into the chassis, at least one of the heat-generating components being in direct contact with a cold plate. The method further includes delivering an immersion coolant within and filling, at least in part, the enclosure to fully immerse the heat-generating components. The method further includes automatically draining, in the closed position, overflow of the immersion coolant accumulated in the enclosure. The method further includes delivering a direct coolant in cooled form within the cold plate, and removing the direct coolant in heated form from the cold plate.

According to some features of the above aspects, the method further includes, in response to manually moving the flap from the closed position to the open position, draining the immersion coolant from the enclosure. According to other features of the above aspects, the method further includes rotating the moving the flap between the closed position and the open position.

According to yet other features of the above aspects, the method further includes receiving the immersion coolant from a supply manifold.

According to yet other features of the above aspects, the method further includes draining the immersion coolant into a recycle manifold.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
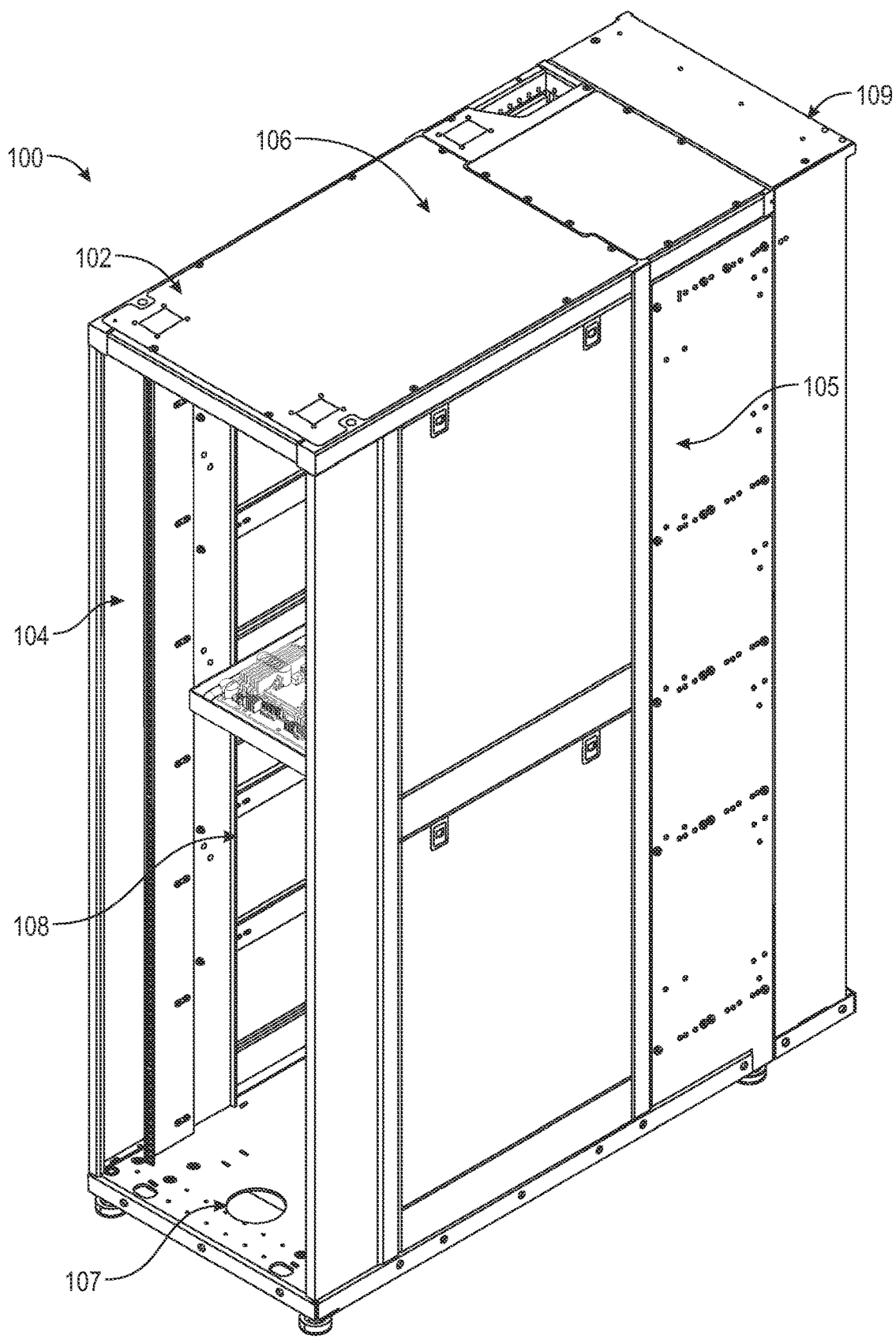
FIG. 1A is a perspective view of a rack for an IT system, according to certain aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1A, an IT system 100 includes a equipment rack 102 that generally forms a cabinet enclosure for housing various IT components. The rack 102 has a left side 104, a right side 105, a top side 106, and a bottom side 107. The enclosed IT components are accessible via one or more of a front opening 108 and a back opening 109.

Figure 1B:
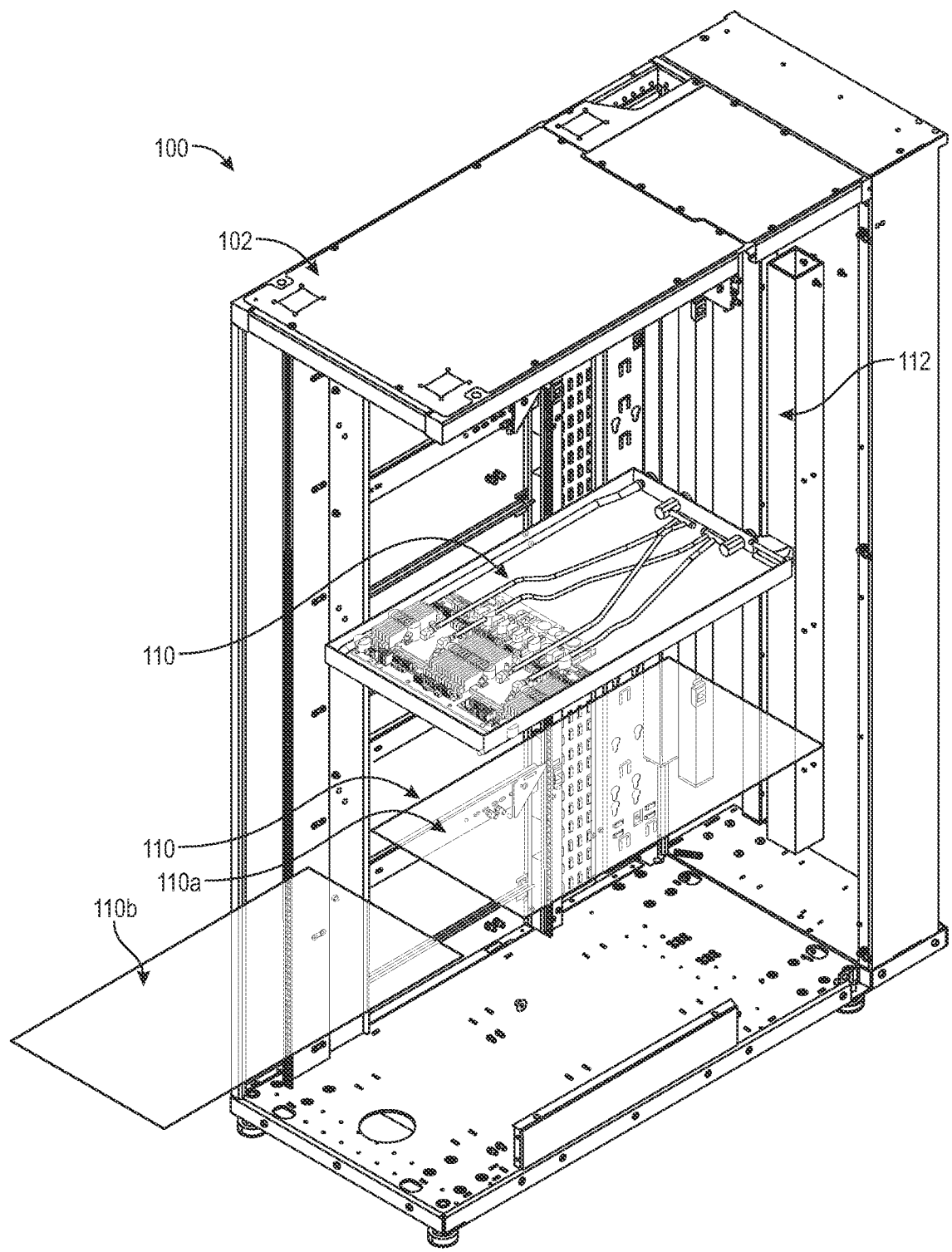
FIG. 1B is a perspective view of the rack of FIG. 1A illustrating some internal components, according to certain aspects of the present disclosure.

Referring to FIG. 1B, the IT system 100 includes a plurality of chassis 110 within the rack 102. For ease of understanding, only one chassis 110 will be further described and illustrated in more detail. In this example, the chassis 110 is a 1 U standard height component, but in other examples the chassis 110 is another standard height, such as a 2 U or 4 U height. Each chassis 110 is in fluid communication with a plurality of coolant manifolds 112. The coolant manifolds 112 are mounted near the back opening 109 of the rack 102. The chassis 110 may be configured for receiving computer components such as application servers, storage servers, storage devices, switches, routers and the like.

Optionally, the chassis 110 is mounted in the rack 102 in a slidable configuration to facilitate ease of service when needed. For example, the chassis 110 is slidable between an enclosed position 110a and a serviceable position 110b. Optionally, each chassis 110 is mounted generally horizontally in the rack 102. In another optional configuration, each chassis 110 is positioned generally parallel to an adjacent chassis 110 in the rack 102. In another optional configuration, each chassis 110 is slotted in the rack 102.

Figure 2:
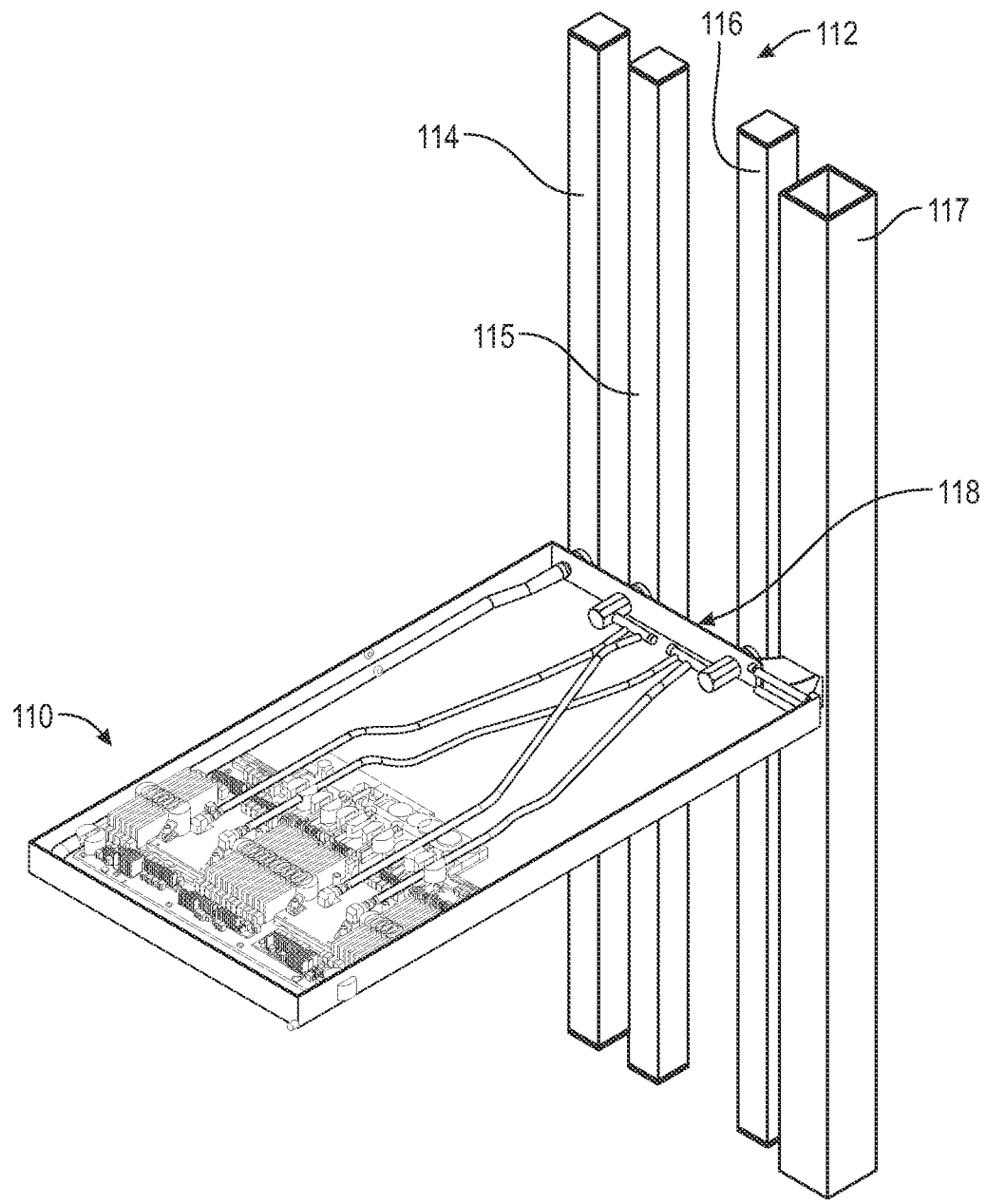
FIG. 2 is a perspective view of a chassis and coolant manifolds for the IT system of FIG. 1A, according to certain aspects of the present disclosure.

Referring to FIG. 2, the chassis 110 is coupled to an immersion manifold 114, a cold manifold 115, a hot manifold 116, and a drainage manifold 17. The immersion and drainage manifolds 114, 117 facilitate flow of coolant in and out of the chassis 110 for immersing the chassis 110 with coolant. The hot and cold manifolds 115, 116 facilitate flow of coolant in and out of the chassis 110 for direct cooling of components within the chassis 110. The flow of coolant is further described in more detail below in reference to FIG. 9.

The manifolds 114-117 are part of the coolant manifolds 112 (referred to in FIG. 1B) and are mounted near a downstream side 118 of the chassis 110. Optionally, the coolant manifolds 112 are mounted generally vertically along the downstream side 118. In another optional configuration, the coolant manifolds 112 are mounted generally parallel to each other along the downstream side 118.

Figure 3:
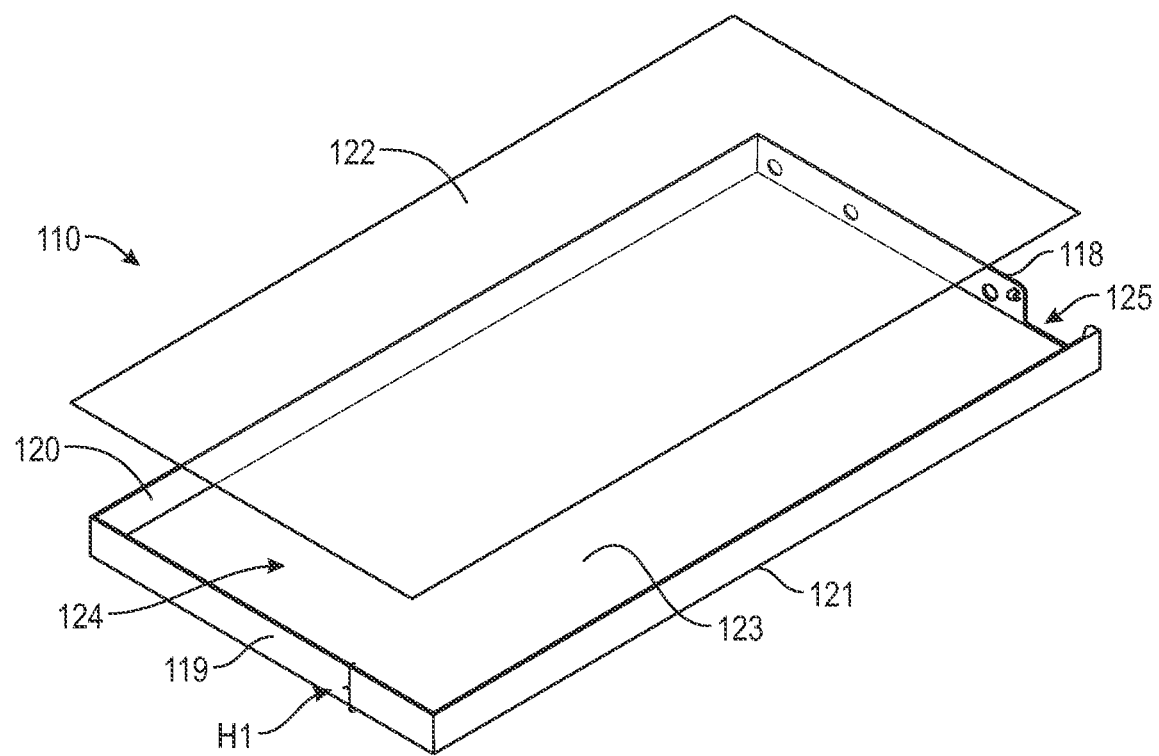
FIG. 3 is a perspective of the chassis of FIG. 2, according to certain aspects of the present disclosure.

Referring to FIG. 3, the chassis 110 is generally in the form of a tray that has a plurality of sides, including the downstream side 118, an upstream side 119, a left side 120, and a right side 121. Optionally, the tray includes a top side 122, which along with a bottom side 123, fully encloses the sides 118-121 to form the tray in a generally liquid-tight compartment. The tray further includes an overflow path 134b and a drainage path 134c discussed below in reference to FIG. 8.

Each of the four sides 118-121 is continuously connected to form an internal enclosure 124 in which an immersion coolant is delivered. According to the illustrated embodiment, each of the four sides 118-121 forms a respective wall having a height H1 that may be a standard server unit height U. The downstream side 118 has a rear opening 125, which (as described below in reference to FIG. 9) provides an outlet for draining the immersion coolant from the chassis 110.

Figure 4:
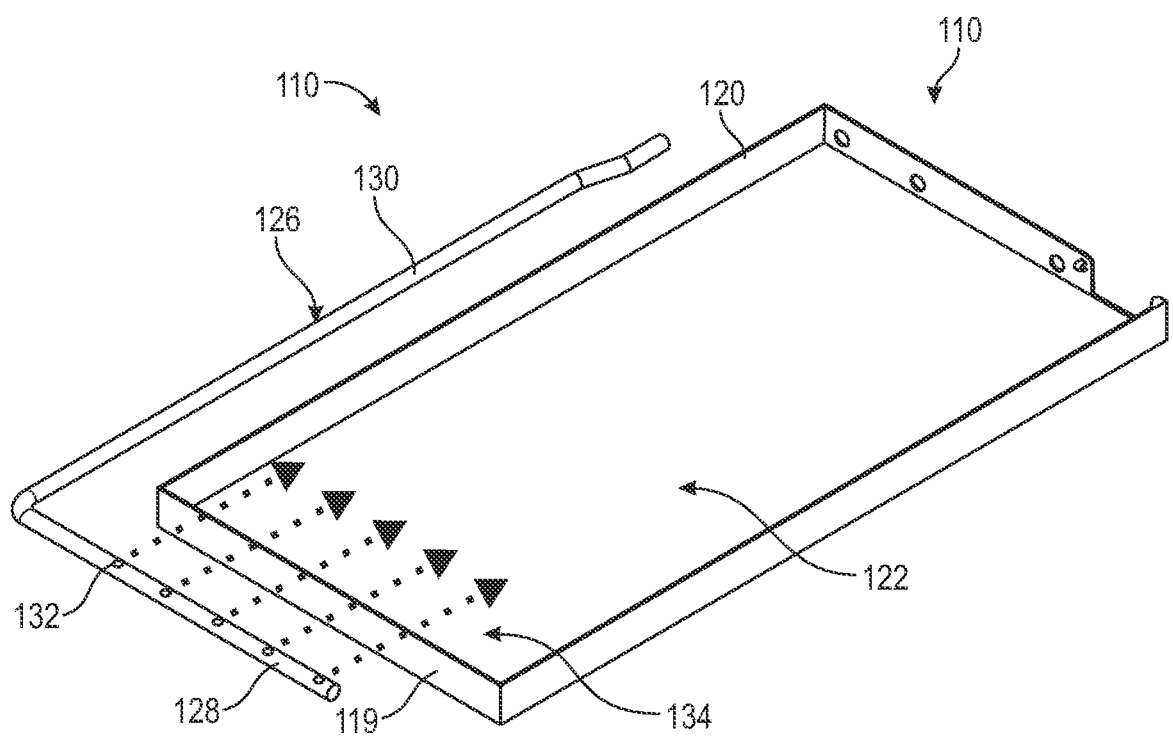
FIG. 4 is an exploded perspective view showing the chassis of FIG. 2 and a supply conduit, according to certain aspects of the present disclosure.

Referring to FIG. 4, the chassis 110 includes an immersion conduit 126 that delivers an immersion coolant to the upstream side 119 within the enclosure 124. The immersion conduit 126 follows in part an L-shape configuration between the left side 120 and the upstream side 119 of the chassis 110. The immersion conduit 126 has a general, respective, L-shape with an upstream member 128 that is generally parallel with and adjacent to the upstream side 119. The upstream member 128 is continuous with and generally perpendicular to a lateral member 130. The lateral member 130 is generally parallel with and adjacent to the left side 120.

The upstream member 128 includes a plurality of supply holes 132 for distributing the immersion coolant 134 to fill the enclosure 124. According to an optional feature, the supply holes 132 are in the form of supply nozzles. According to another optional embodiment, the immersion conduit 126 is in part or in its entirety a tubular conduit with a generally circular cross-sectional profile.

Figure 5:
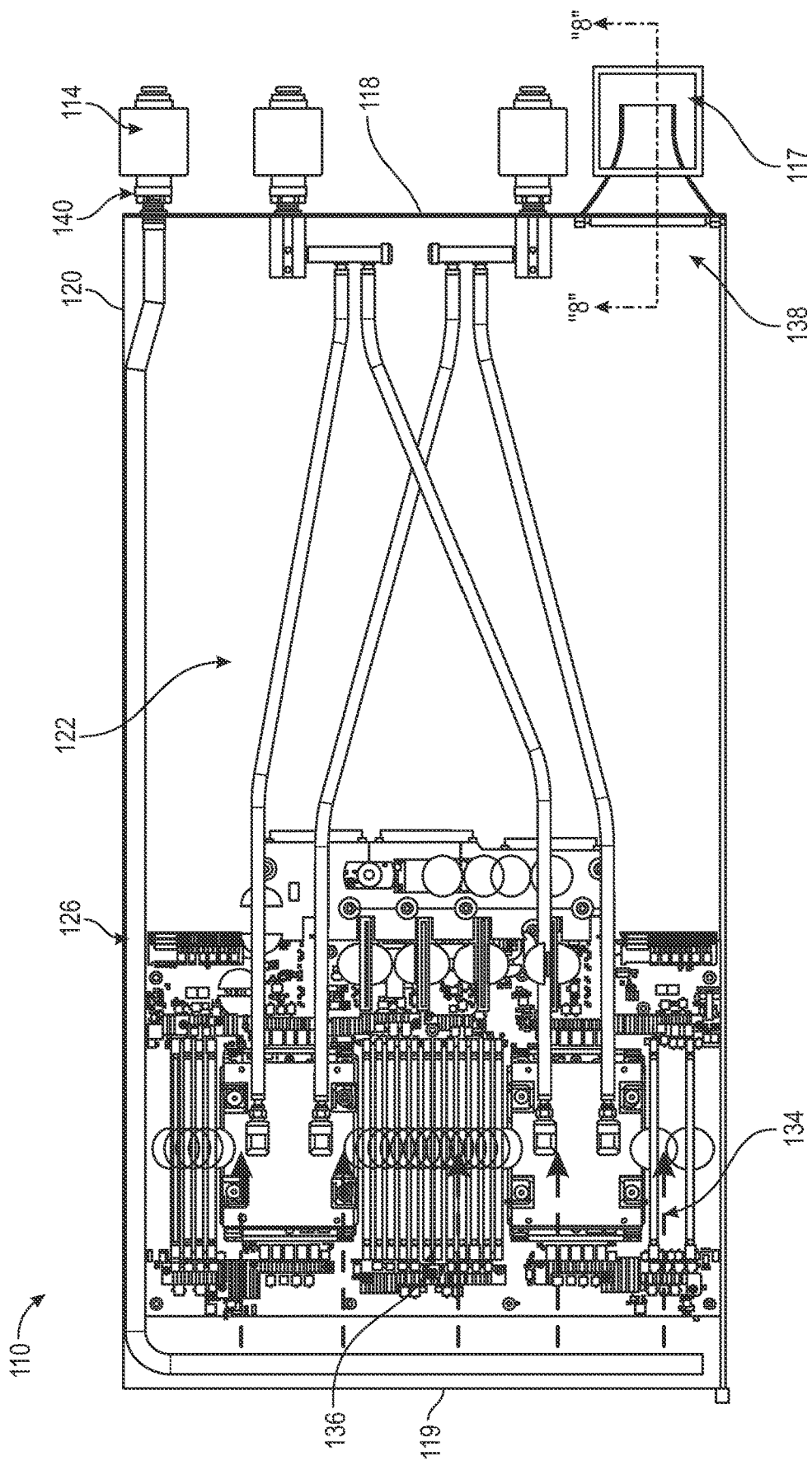
FIG. 5 is a top view of the chassis of FIG. 2 illustrating immersion cooling, according to certain aspects of the present disclosure.

Referring to FIG. 5, the chassis 110 further includes one or more heat-generating components 136 and a drainage mechanism 138, within the enclosure 124. The heat-generating components 136 are mounted adjacent to the upstream side 119, within the enclosure 124. The immersion conduit 126 delivers the immersion coolant 134 to the upstream side 119 within the enclosure 124.

The immersion conduit 126 is fluidly coupled to the immersion manifold 114 via a quick-disconnect connector 140 (i.e., a first quick-disconnect connector). The quick-disconnect connector 140 is mounted along the downstream side 118, near the left side 120. The quick-disconnect connector 140 facilitates quick, easy, and toolless connection and disconnection of the immersion conduit 126 from the immersion manifold 114. The immersion manifold 114 is generally a coolant supply source that delivers the immersion coolant 134 to the immersion conduit 126. For example, the immersion manifold 114 supplies fresh, cold liquid coolant 134 into each chassis 110.

Accumulated immersion coolant 134 is drained into the drainage manifold 117, which provides a flow outlet towards a drainage source. As explained below in more detail, the drainage manifold 117 receives the immersion coolant 134 either via the overflow path 134b or the drainage path 134c (illustrated in FIG. 8).

Figure 6:
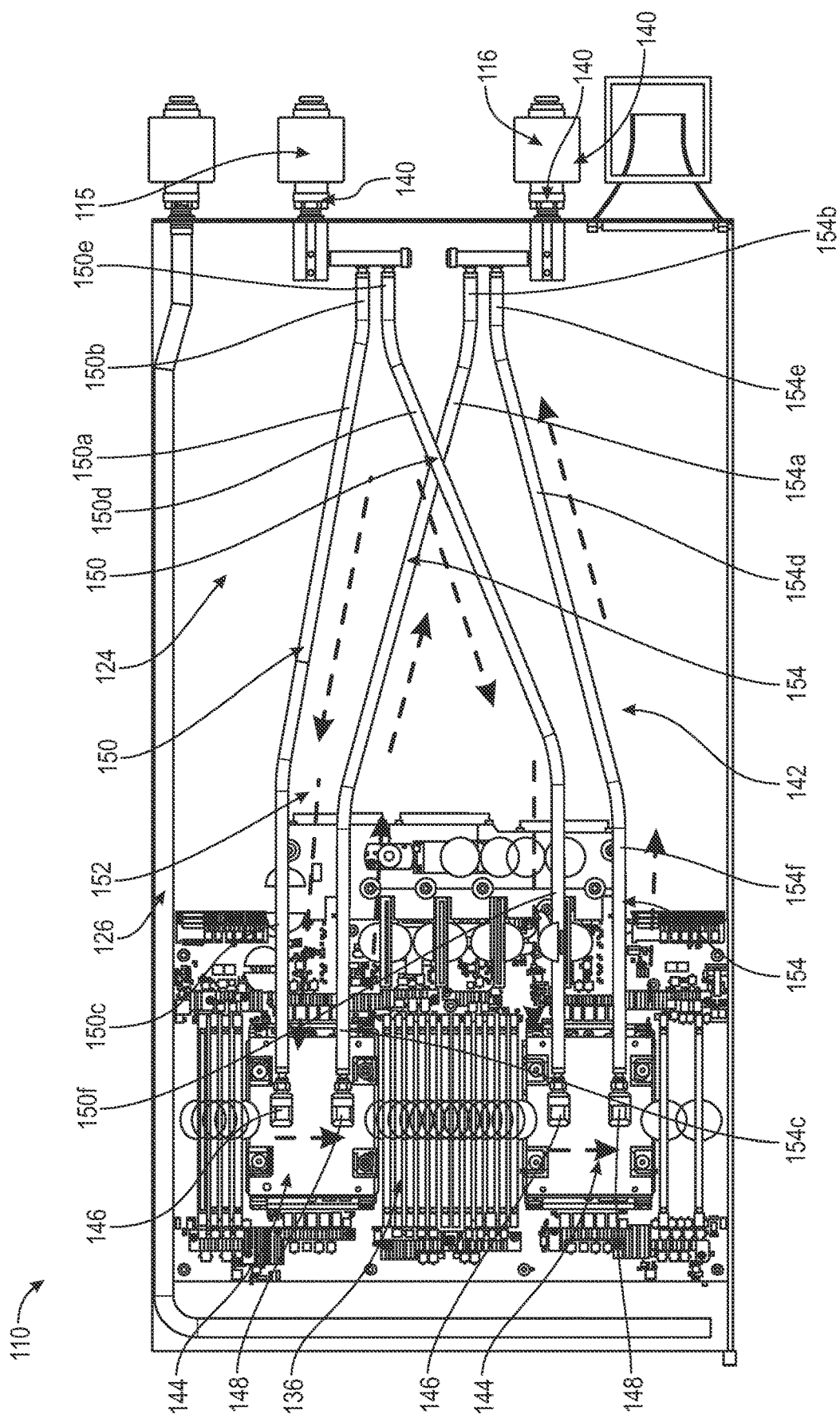
FIG. 6 is a top view of the chassis of FIG. 2 illustrating direct cooling, according to certain aspects of the present disclosure.

Referring to FIG. 6, the chassis 110 further includes, mounted within, a direct cooling system 142 that works simultaneous with the immersion conduit 126 to cool the heat-generating components 136. Thus, the direct cooling system 142 and the immersion conduit 126 provide a hybrid cooling system that enhances cooling aspects, advantageously contributing to high performance of the heat-generating components 136.

The direct cooling system 142 includes at least one cold plate 144 that is positioned within the internal enclosure 124 and is configured for mounting in direct contact with at least one of the heat-generating components 136, such as a CPU chip or a GPU chip. The cold plate 144 has an inlet connector 146 and an outlet connector 148. According to other examples, the direct cooling system 142 includes two or more cold plates 144. The example of FIG. 6 illustrates an example with two cold plates 144.

The direct cooling system 142 further includes a supply conduit 150 for delivering a direct coolant 152 in cooled form within conduits of the cold plate 144. At one end, the supply conduit 150 is in flow communication with the inlet connector 146. At another end, the supply conduit 150 is in flow communication with the cold manifold 115, which supplies the direct coolant 152 in the cooled form.

The direct cooling system 142 also includes a return conduit 154 for removing the direct coolant 152, in heated form, from the cold plate 144. At one end, the return conduit 154 is in flow communication with the outlet connector 148. At another end, the return conduit 154 is in flow communication with the hot manifold 116, which removes the direct coolant 152.

According to one exemplary embodiment, the direct coolant 152 is the same as the immersion coolant 134. In another example, the direct coolant 152 is different than the immersion coolant 134. In yet another, more specific example, the direct coolant 152 is a dielectric fluid, such as water, that is more efficient in heat transfer than the immersion coolant. The immersion coolant is generally a non-dielectric fluid, such as an oil-based coolant.

The direct cooling system 142 further includes quick-disconnect connectors 140 for quick coupling or decoupling of the supply conduit 150 and the return conduit 154. Accordingly, the supply conduit 150 can be quickly coupled or decoupled, via a respective quick-disconnect connector 140 (i.e., a second quick-disconnect connector) without using tools, from the cold manifold 115. Similarly, the return conduit 154 can be quickly coupled or decoupled, via a respective quick-disconnect connector 140 (i.e., a third quick-disconnect connector) without using tools, from the hot manifold 116.

Each of the supply and return conduits 150, 154 are routed and shaped to achieve the flow of the direct coolant 152 between the respective manifolds 115, 116 and the cold plate 144. According to the illustrated example, one of the supply conduits 150 has a diagonal section 150a continuous between a straight entry section 150b and a straight exit section 150c. According to another one of the supply conduits 150, a diagonal section 150d has a greater angle of change between a straight entry section 150e and a straight exit section 150f. The change in angle accommodates a greater distance between the cold manifold 115 and the respective cold plate 144.

Similarly, one of the return conduits 154 has a diagonal section 154a that extends continuously between a straight entry section 154b and a straight exit section 154c. According to another one of the return conduits 154, a diagonal section 154d has a greater angle of change between a straight entry section 154e and a straight exit section 154f. The change in angle accommodates a greater distance between the hot manifold 116 and the respective cold plate 144.

Figure 7A:
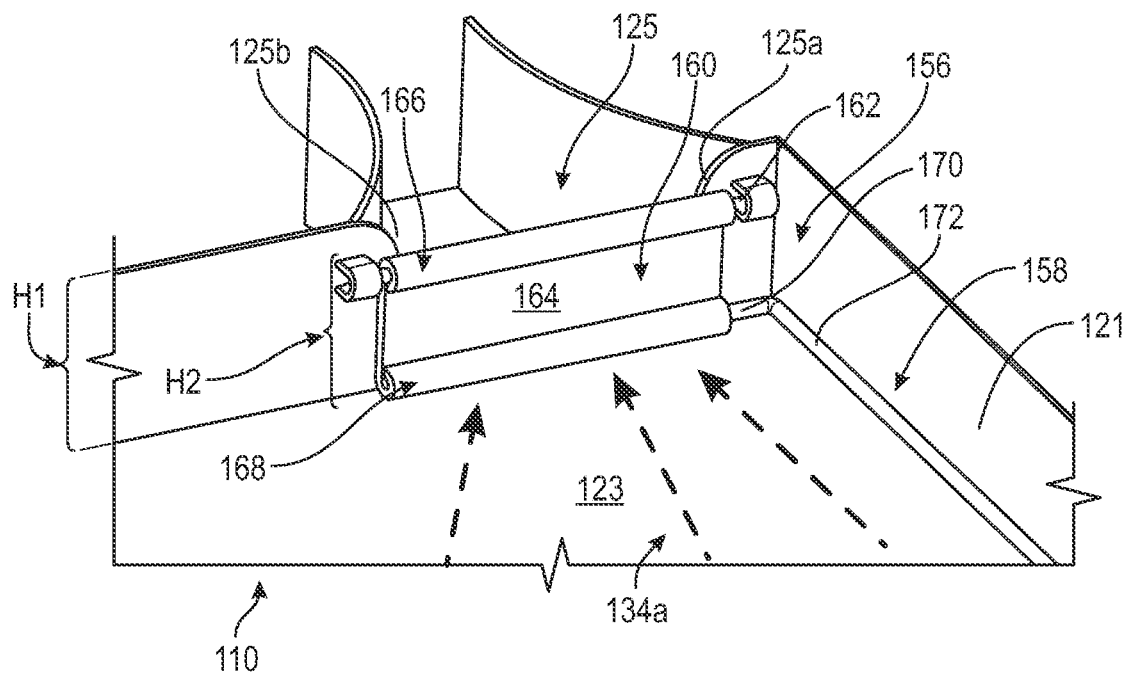
FIG. 7A is a perspective view illustrating a flap mechanism in a closed position, according to certain aspects of the present disclosure.
Figure 7B:
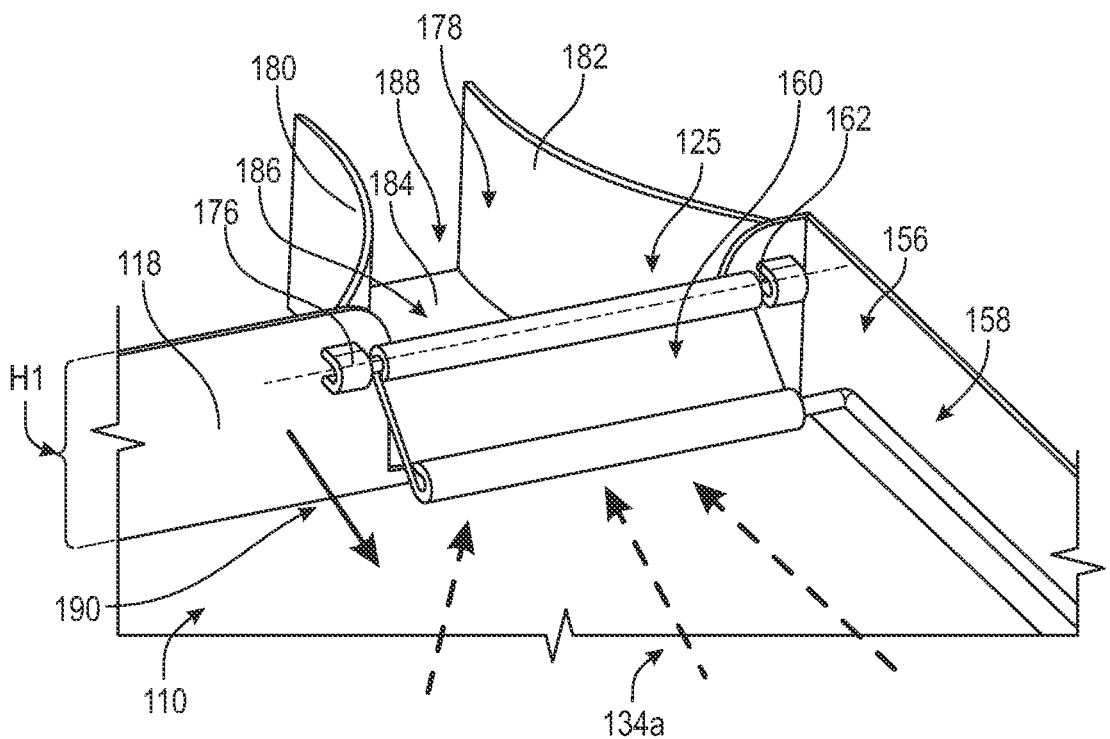
FIG. 7B is a perspective view illustrating the flap mechanism of FIG. 7A in an open position, according to certain aspects of the present disclosure.

Referring to FIGS. 7A and 7B, the chassis 110 has a flap mechanism 156 that is movable between a closed position (illustrated in FIG. 7A) and an open position (illustrated in FIG. 7B). Referring specifically to FIG. 7A, the flap mechanism 156 includes a flap handle 158 and a flap door 160. The flap door 160 is rotatably coupled to the chassis 110 via a flap rod 162, which extends across the rear opening 125 near (but below) the height H1 of the downstream side 118. The flap door 160 extends between two opposing sides 125a, 125b of the rear opening 125.

The flap door 160 is generally in the form of a plate 164 having a height H2 that does not fully block the rear opening 125. The height H2 of the flap door 160 is smaller than the height H1 of the four sides 118-121. At opposing ends of the plate 164, along the height H2, the flap door 160 has inwardly curved ends 166, 168. The inwardly curved ends 166, 168 include a pivoting end 166 and an actuating end 168. The pivoting end 166 is configured with an internal hole, which receives within the flap rod 162, and the actuating end 168 is configured with a similar internal hole, which receives securely within an actuator portion 170 of the flap handle 158.

The flap handle 158 has a lever portion 172 that extends along the right side 121 of the chassis 110, near the bottom side 123 of the chassis 110. The lever portion 172 is continuously connected in a general perpendicular configuration with the actuator portion 170. In turn, the actuator portion 170 is coupled to the flap door 160, for moving the flap door 160.

In the closed position (FIG. 7A), the flap mechanism 156 prevents accumulated coolant 134a from draining from the chassis 110. In the open position (FIG. 7B), the flap mechanism 156 allows the accumulated coolant 134a to drain from the chassis 110.

More specifically, referring now to FIG. 7B, the flap door 160 rotates along a pivoting axis 176, which is along and coincident with an axis of the flap rod 162. The rotation of the flap door 160 along the pivoting axis 176 moves the flap door 160 between the open and closed positions.

The movement of the flap door 160 is achieved via a pulling or pushing force of the flap handle 158, to which the flap door 160 is connected. When the flap door 160 moves away from the downstream side 118, in a direction 190, the flap handle 158 causes the flap door 160 to rotate towards the open position. As a result, the accumulated coolant 134a drain in an opposite flow direction relative to the direction 190 in which the flap door 160 generally rotates.

The chassis 110 further has an outlet duct 178 mounted to the rear opening 125 for draining the accumulated coolant 134a. The outlet duct 178 has two curved sides 180, 182 extending generally perpendicular from a duct base 184. The curved sides 180, 182 flare inwardly from a connecting side 186 to an outlet side 188. Thus, the connecting side 186 is larger than the outlet side 188, achieving a funneling effect when draining the immersion coolant. Each of the curved sides 180, 182 has a height that is generally the same as the height H1 of the chassis 110.

Figure 8:
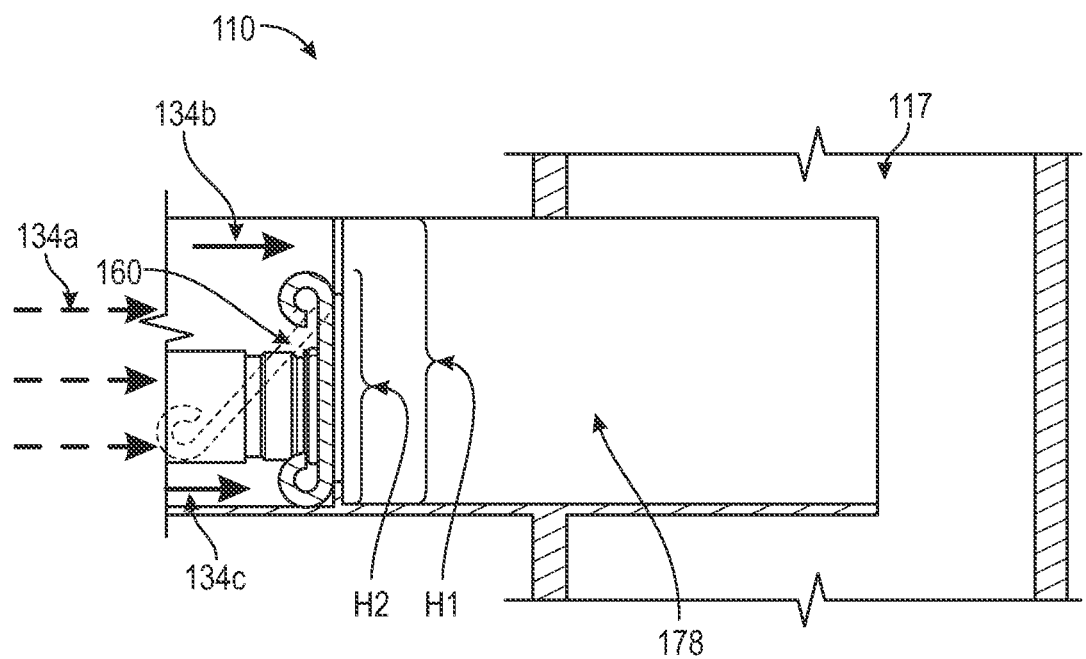
FIG. 8 is an enlarged cross-sectional view along lines "8"-"8" of FIG. 5, illustrating a drainage area, according to certain aspects of the present disclosure.

Referring to FIG. 8, draining the accumulated coolant 134a from the chassis 110 occurs in two ways. A first way is to have overflow of the accumulated coolant 134a flow along the overflow path 134b, above the flap door 160. The overflow occurs in part based on the difference in height between (a) the height H1 of the chassis 110 and (b) the lower height H2 of the flap door 160. This first way is typically during operation of the heat-generating components 136. A second way is to drain the accumulated coolant 134a by opening the flap door 160. The drainage process typically occurs when one or more components in the chassis 110 requires servicing, which requires removal of the immersion coolant 166. The system 100 is generally turned OFF, discontinuing computing operation while servicing occurs. The drainage occurs below the flap door 160, along a drainage path 134c, into the outlet duct 178, and subsequently into the drainage manifold 117.

The drainage manifold 117 collects the received coolant, e.g., liquid, and routes the heated coolant to a heat exchanger system (not shown) to dissipate the heat carried in the heated coolant and provide fresh cold coolant. The heat exchanger system may include pump mechanisms to circulate the coolant and heat exchange infrastructure such as fans or liquid to liquid heat transfer to dissipate the heat from the heated coolant.

Figure 9:
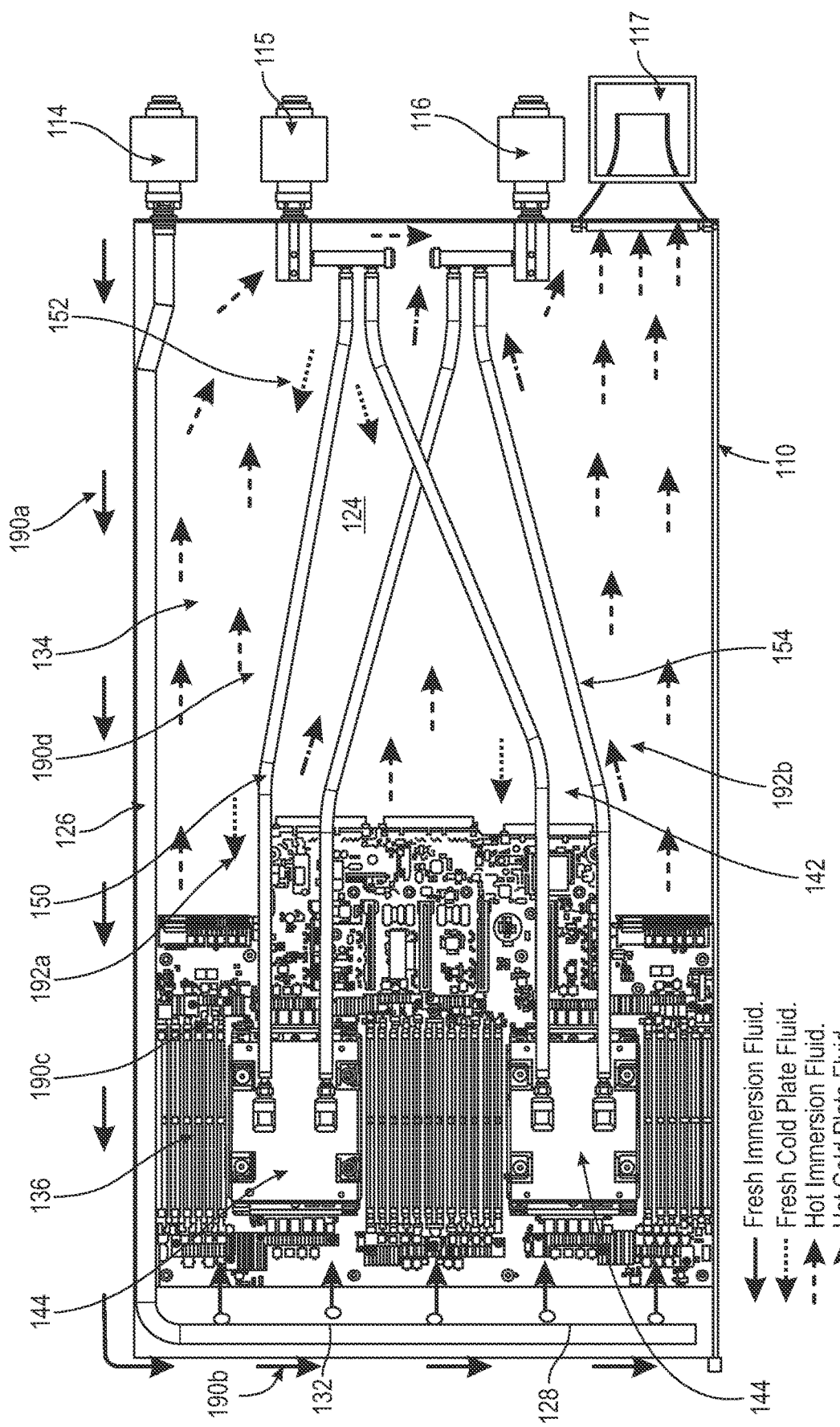
FIG. 9 is a top view illustrating coolant flow in the chassis of FIG. 5, according to certain aspects of the present disclosure.

Referring to FIG. 9, the immersion coolant 134 fills the enclosure 124 of the chassis 110, in a default cooling operating state. The immersion coolant 134 is supplied via the immersion conduit 126. Specifically, the upstream member 128 of the immersion conduit 126 inserts the immersion coolant 134 via the supply holes 132.

The immersion coolant 134 is delivered from the immersion manifold 114, filling up the enclosure 124 to cool the heat-generating components 136. In other words, the heat-generating components 136 are fully immersed in the immersion coolant 134.

The flow path of the immersion coolant 134 includes an initial path 190a along the lateral member 130, a secondary path 190b along the upstream member 128, a cooling path 190c over the heat-generating components 136, and a non-cooling path 190d past the heat-generating components 136. Eventually, the immersion coolant 134 is drained into the drainage manifold 117.

Additionally, to achieve the hybrid cooling aspect, the direct coolant 152 flows through the direct cooling system 142 to achieve a higher degree of cooling for the heat-generating components 136. The direct coolant 152, e.g., a fresh cold plate fluid, is delivered from the cold manifold 115. The direct coolant 152 flows initially along an inlet path 192a of the supply conduit 150, from the cold manifold 115 to the cold plate 144. Then, the direct coolant 152 returns from the cold plate 144 along a return path 192b of the return conduit 154, and into the hot manifold 116.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A hybrid cooling system for an information technology (IT) device, the hybrid cooling system comprising:
    a chassis having a peripheral wall that extends between a chassis base and an open top surface, the peripheral wall forming an enclosure between an upstream side and a downstream side, the chassis being configured to receive heat-generating components of the IT device within the enclosure;
    an immersion conduit for delivering an immersion coolant within the enclosure, the immersion coolant filling the enclosure to immerse the heat-generating components;
    an outlet duct for draining overflow of the immersion coolant accumulated in the enclosure;
    a cold plate positioned within the enclosure and configured for mounting in direct contact with at least one of the heat-generating components, the cold plate having an inlet connector and an outlet connector;
    a supply conduit for delivering a direct coolant in cooled form within the cold plate, the supply conduit being in flow communication with the inlet connector; and
    a return conduit for removing the direct coolant in heated form from the cold plate, the return conduit being in flow communication with the outlet connector;
    wherein the chassis has a rear opening in the downstream side, the rear opening blocked by a movable flap in a closed position, the movable flap having a flap height that is lower than a wall height of the peripheral wall.

2. The hybrid cooling system of claim 1, wherein the outlet duct automatically receives the overflow of the immersion coolant when an accumulation of the immersion coolant reaches the flap height.

3. The hybrid cooling system of claim 1, wherein the movable flap is rotatable between the closed position, in which at least some of the immersion coolant accumulates in the enclosure, and an open position, in which at least some of the immersion coolant drains from the enclosure.

4. The hybrid cooling system of claim 1, wherein the immersion conduit is routed alongside a lateral side the peripheral wall that extends between the upstream side and the downstream side.

5. The hybrid cooling system of claim 4, wherein the immersion conduit has an inlet end that is fluidly coupled with an immersion quick-disconnect connector, the immersion quick-disconnect connector being mounted in the downstream side near the lateral side.

6. The hybrid cooling system of claim 5, wherein the immersion conduit has an immersion-delivery side positioned along the upstream side, the immersion conduit delivering the immersion coolant near the upstream side.

7. The hybrid cooling system of claim 1, wherein the direct coolant is different than the immersion fluid.

8. The hybrid cooling system of claim 7, wherein the direct coolant is a dielectric fluid and the immersion fluid is a non-dielectric fluid.

9. The hybrid cooling system of claim 1, further comprising:
    another cold plate positioned within the enclosure and configured for mounting in direct contact with at least one of the heat-generating components, the another cold plate having another inlet connector and another outlet connector;
    another supply conduit for delivering another direct coolant in cooled form within the cold plate, the another supply conduit being in flow communication with the another inlet connector; and another return conduit for removing the another direct coolant in heated form from the another cold plate, the another return conduit being in flow communication with the another outlet connector.

10. A method for hybrid cooling of an information technology (IT) system, the method comprising:
providing a chassis with a peripheral wall extending between a chassis base and an open top surface, the peripheral wall forming an enclosure between an upstream side and a downstream side, the peripheral wall having a rear opening blocked with a flap, the flap being movable between a closed position and an open position, the movable flap having a flap height that is lower than a wall height of the peripheral wall;
receiving heat-generating components of the IT system into the chassis, at least one of the heat-generating components being in direct contact with a cold plate;
delivering an immersion coolant within and filling, at least in part, the enclosure to fully immerse the heat-generating components;
automatically draining, in the closed position, overflow of the immersion coolant accumulated in the enclosure;
delivering a direct coolant in cooled form within the cold plate; and
removing the direct coolant in heated form from the cold plate.

11. The method of claim 10, further comprising, in response to manually moving the flap from the closed position to the open position, draining the immersion coolant from the enclosure.

12. The method of claim 11, further comprising rotating the moving the flap between the closed position and the open position.

13. The method of claim 10, further comprising receiving the immersion coolant from a supply manifold.

14. The method of claim 10, further comprising draining the immersion coolant into a recycle manifold.

* * * * *